United States Patent [19]

Egli et al.

[11] 4,287,809

[45] Sep. 8, 1981

[54] HELMET-MOUNTED SIGHTING SYSTEM

[75] Inventors: Werner H. Egli, Minneapolis; Dennis Kuhlmann, New Brighton; Jack E. Wier, Roseville, all of Minn.

[73] Assignee: Honeywell Inc., Minneapolis, Minn.

[21] Appl. No.: 68,296

[22] Filed: Aug. 20, 1979

[51] Int. Cl.[3] ........................ F41G 9/00; G01R 33/02

[52] U.S. Cl. .................................. 89/41 EA; 324/72; 324/260; 324/261

[58] Field of Search ........................ 324/260, 261, 72; 89/41 EA

[56] References Cited

U.S. PATENT DOCUMENTS

| | | | |
|---|---|---|---|
| Re. 23,397 | 8/1951 | Felch, Jr. et al. | 175/183 |
| 2,824,304 | 2/1958 | Dorsett | 343/117 R |
| 3,078,042 | 2/1963 | Grado | 235/187 |
| 3,133,283 | 5/1964 | Ghose | 343/100 R |
| 3,309,690 | 3/1967 | Moffitt | 324/72 X |
| 3,354,459 | 11/1967 | Schwartz et al. | 343/100 R |
| 3,432,751 | 3/1969 | Godby et al. | 324/260 |
| 3,868,565 | 2/1975 | Kuipers | 324/34 R |
| 3,952,308 | 4/1976 | Lammers | 343/108 R |
| 3,983,474 | 9/1976 | Kuipers | 324/43 R |
| 4,017,858 | 4/1977 | Kuipers | 343/100 R |
| 4,034,401 | 7/1977 | Mann | 89/41 EA |
| 4,054,881 | 10/1977 | Raab | 324/227 |
| 4,146,196 | 3/1979 | Schultz | 244/3.1 |

FOREIGN PATENT DOCUMENTS

| | | | |
|---|---|---|---|
| 557334 | 4/1975 | U.S.S.R. | 324/260 |

*Primary Examiner*—Malcolm F. Hubler
*Attorney, Agent, or Firm*—Trevor B. Joike

[57] ABSTRACT

An electromagnetic system for determining the orientation including position of a helmet worn by a pilot is disclosed, having a transmitting antenna for transmitting electromagnetic field vectors, a receiving antenna for sensing the electromagnetic field vectors, a control apparatus responsive to the sensed electromagnetic field vectors and the transmitted electromagnetic field vectors for determining the orientation including location of the helmet, the control apparatus having a first output for supplying the orientation to a utilization apparatus and a second output, a driver for supplying driving energy to the transmitting antenna coils, and a selector switch connected to the second output of the control apparatus and to the driver for sequentially energizing the coils of the transmitting antenna.

42 Claims, 16 Drawing Figures

HELMET-MOUNTED SIGHTING SYSTEM

BACKGROUND OF THE INVENTION

This invention relates to a system for determining the orientation and position of a helmet, and, more particularly, an electromagnetic arrangement especially suited for determining the orientation and position of a helmet such as that worn by the pilot of an aircraft as he visually follows a target.

The system involves a control apparatus for sensing the orientation of a helmet, particularly for the pilot of an aircraft, to control various functions of the vehicle in which the helmet is worn based upon the target at which the wearer is looking. For example, the orientation of the helmet may be used to control the direction of fire for a Gatling gun on a helicopter, to input target location data into the guidance systems of air-to-air or air-to-ground missiles and/or to aid the radar system of an aircraft in locking on to a selected target. The helmet may include a reticle generator used by the pilot to visually line up the target so that the helmet will follow his head movements.

SUMMARY OF THE INVENTION

The present invention provides an electromagnetic system for determining the orientation of a helmet having a transmitting antenna for transmitting electromagnetic field vectors, the transmitting antenna having at least two transmitting coils, a receiving antenna mounted to the helmet and having three non-coplanar receiving coils for sensing the electromagnetic field vectors transmitted by the transmitting antenna, an apparatus connected to the receiving antenna for determining the orientation of the helmet based upon the sensed and transmitted electromagnetic field vector of a driver for supplying driving energy to the transmitting antenna, and a selector switch connected to the apparatus and to the driver for sequentially supplying the driving energy to the coils of the transmitting antenna.

BRIEF DESCRIPTION OF THE DRAWINGS

These and other features and advantages will become more apparent from a detailed consideration of the invention when taken in conjunction with the drawings in which.

DETAILED DESCRIPTION

Figure 12:
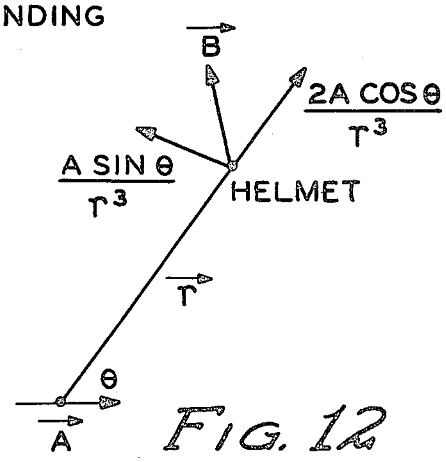
FIG. 12 is a diagram showing the transmitted vector from a dipole antenna and the received magnetic field vector useful in the mathematical analysis of the instant invention.

In determining the orientation of the receiving antenna, which is mounted to a helmet, with respect to the transmitting antenna which transmits the electromagnetic field vectors, it is first assumed, as shown in FIG. 12, that an ideal magnetic dipole transmitter transmits a magnetic moment defined by the vector $\vec{A}$ whose magnitude represents the dipole strength and whose direction represents the dipole orientation. The magnetic potential at vector distance $\vec{r}$ may then be represented by the following equation:

$$\Phi(\vec{r}) = \vec{A}\cdot\vec{r}/R^3 = \frac{A\cos\theta}{R^2} \quad (1)$$

where R is the magnitude of $\vec{r}$ and A as the magnitude of $\vec{A}$. The magnetic field vector may then be determined by taking the gradient of the magnetic potential shown in equation (1). If the negative of the gradient is taken along polar coordinates, the following equation results:

$$\vec{B}(\vec{r}) = \vec{U}_r\frac{2A\cos\theta}{R^3} + \vec{U}_\theta\frac{A\sin\theta}{R^3} \quad (2)$$

where $U_r$ is the unit vector in the $\vec{r}$ direction and $\vec{U}_\theta$ is the unit vector in the $\theta$ direction. The $\vec{U}_\theta$ component can be resolved into the $\vec{A}$ and $\vec{U}_r$ components as follows:

$$\vec{U}_\theta\frac{A\sin\theta}{R^3} = \frac{-\vec{A}}{R^3} + \vec{U}\frac{A\cos\theta}{R^3}. \quad (3)$$

Substituting equation (3) into equation (2) and combining terms, equation (2) becomes:

$$\vec{B}(\vec{r}) = -\frac{\vec{A}}{R^3} + \vec{U}\frac{3A\cos\theta}{R^3} \quad (4)$$

$$= -\frac{1}{R^3}(\vec{A} - \vec{U}3\vec{A}\cdot\vec{U}) \quad (5)$$

$$= -\frac{1}{R^3}(\vec{A} - 3\vec{U}\vec{U}^T\vec{A}) \quad (6)$$

$$= -\frac{1}{R^3}(I - 3\vec{U}\vec{U}^T)\vec{A} \quad (7)$$

$$= -\frac{1}{R^3}M\vec{A} \quad (8)$$

where the subscript r has been dropped from the column vector $\vec{U}_r$, $M = I - 3\vec{U}\vec{U}^T$, and the superscript $T$ indicates the transpose.

$\vec{B}$ is sensed by a triad of pick-off coils mounted on the helmet which gives the components of $\vec{B}$ along the helmet triad axis, i.e. the value of $\vec{B}$ expressed in the helmet coordinate frame. To determine the helmet orientation and its range, which comprises six independent variables, we need at least six data points. If we generate three different $\vec{A}$ vectors at the transmitter, and observe the resulting nine components of $\vec{B}$ sensed by the helmet triad, we get nine data, which "overdetermines" the solution. However, the resulting redundancy is helpful in getting a least-squares fit in the presence of inevitable noise and error. The value of $\vec{B}$ is sensed by the helmet triad as:

$$\vec{C}=H\vec{B}=-(1/R^3)HM\vec{A} \quad (9)$$

where H represents the rotation matrix representing the helmet orientation relative to the transmitting antenna coordinate axes. For three transmit/receive sequences, using three different $\vec{A}$'s, and hence generating three different $\vec{C}$'s, the resulting three vector equations of form equation (9) may be combined into a single matrix equation:

$$Y=-(1/R^3)HMX \quad (10)$$

where X is a 3×3 matrix whose columns are the three $\vec{A}$ vectors and Y is a 3×3 matrix whose columns are the three $\vec{C}$ vectors. Since the rotation matrix represents the solution to the problem, equation (10) can be rewritten as:

$$H=-R^3YX^{-1}M^{-1}. \quad (11)$$

In equation (11), the Y matrix is known since this matrix is comprised of the measured quantities and the X matrix is known since this is comprised of the transmitted quantities. It is then necessary to solve for the M matrix and for $R^3$ in order to complete the calculation of the H matrix.

In computing the component values for the M matrix, it is convenient to first determine the major eigenvalue which is then used in turn to determine the components of the eigenvector useful in completing the components of the M matrix. To determine the eigenvalue, the rotation matrix term H is first eliminated from equation (11). Thus, equation (11) is rewritten as:

$$-(1/R^3)HM=YX^{-1}. \quad (12)$$

Equation (12) can also be rewritten as its transpose to yield the following equation:

$$-(1/R^3)(HM)^T=(YX^{-1})^T. \quad (13)$$

Next, equations (12) and (13) are multiplied together to yield the following equation:

$$(1/R^6)(HM)^THM=(YX^{-1})^TYX^{-1} \quad (14)$$

Since the transpose of the product of two matrices is identical to the product of the transpose of the individual matrices, since H is a rotation matrix such that its transpose is identical to its inverse, and since M is a symmetrical matrix such that its transpose is equal to itself, equation (14) can be reduced to the following:

$$(1/R^6)M^2=(YX^{-1})^TYX^{-1} \quad (15)$$

The eigenvalues for equation (15) may be determined by solving the following equation:

$$DET(EI-(YX^{-1})^TYX^{-1})=0 \quad (16)$$

where E represents the eigenvalues. Equation (16) can be rewritten in the form:

$$E^3-BE^2-CE+D=0 \quad (17)$$

where B, C and D represent the constants of the equation. Since it is necessary to solve only for the major eigenvalue, the following two equations are useful:

$$E_o=(\tfrac{2}{3})B \quad (18)$$

$$E_{n+1}=[E_n^2(E_n-B)+D]/C \quad (19)$$

where equation (18) represents a first guess for the major eigenvalue and is used in equation (19) where n is equal to 0 for the first computation of the major eigenvalue to repetitively solve for the major eigenvalue as n is increased from 0 to a number sufficiently large so that the change in the major eigenvalue becomes very small between iterations.

Having determined the eigenvalue, the main eigenvector $\vec{U}$, is determined by first forming the adjoint matrix of the left hand side of equation (16) and then selecting in the adjoint matrix the column whose squared magnitude is the largest. Any column may be used but since any individual column may vanish at certain receiver locations, the largest squared magnitude is selected for computational accuracy. Next the eigenvector is normalized to represent the unit direction vector $\vec{U}$ according to the following equations:

$$|\vec{U}'| = \sqrt{(U_1')^2 + (U_2')^2 + (U_3')^2} \quad (20)$$

$$U_1 = U_1'/|\vec{U}'| \quad (21)$$

$$U_2 = U_2'/|\vec{U}'| \quad (22)$$

$$U_3 = U_3'/|\vec{U}'| \quad (23)$$

where $U_1'$, $U_2'$ and $U_3'$ are the values of the selected components from the adjoint matrix yielding the largest $\vec{U}$ as determined by equation (20).

As discussed above, the matrix M can be described with the following formula:

$$M=I-3\vec{U}\vec{U}^T \quad (24)$$

The inverse matrix, $M^{-1}$, can be written as:

$$M^{-1} = I - \frac{3}{2}\vec{U}\vec{U}^T = \begin{bmatrix} 1-(3/2)U_1^2 & -(3/2)U_1U_2 & -(3/2)U_1U_3 \\ -(3/2)U_1U_2 & 1-(3/2)U_2^2 & -(3/2)U_2U_3 \\ -(3/2)U_1U_3 & -(3/2)U_2U_3 & 1-(3/2)U_3^2 \end{bmatrix}. \quad (25)$$

Thus, the values for $U_1$, $U_2$ and $U_3$ as derived from equations (21), (22) and (23) are inserted into equation (25) and the inverse matrix is computed.

A somewhat simpler method of determining $\vec{U}$ follows directly from the definitions of M and $M^2$:

$$M = I - 3\vec{U}\vec{U}^T = \begin{bmatrix} 1-3U_1^2 & -3U_1U_2 & -3U_1U_3 \\ -3U_1U_2 & 1-3U_2^2 & -3U_2U_3 \\ -3U_1U_3 & -3U_2U_3 & 1-3U_3 \end{bmatrix} \quad (26)$$

$$M^2 = (I - 3\vec{U}\vec{U}^T)^2 = I + 3\vec{U}\vec{U}^T = \begin{bmatrix} 1+3U_1^2 & 3U_1U_2 & 3U_1U_3 \\ 3U_1U_2 & 1+3U_2^2 & 3U_2U_3 \\ 3U_1U_3 & 3U_2U_3 & 1+3U_3^2 \end{bmatrix} \quad (27)$$

$M^2$ can be determined by multiplying equation 15 by $R^6$ where R is determined from the equation:

$$R = \left( KG_TG_R \sqrt{\frac{6}{\sum_{ij} y_{ij}^2}} \right)^{\frac{1}{3}} \text{ where } \sum_{ij} y_{ij}^2 \tag{28}$$

is the sum of the squares of all of the values in the input matrix, Y. Hence, we can compute $U_1$, $U_2$, and $U_3$ directly from a knowledge of $M^2$.

Either approach can be used to solve for the rotation matrix but the approach using equations 1–25 will be specifically used. Thus, the rotation matrix formula of equation (11) can be rewritten then in the following form:

$$H = -G^1YX^{-1}M^{-1} \tag{29}$$

where G is dependent upon the range or distance of the receiving antenna from the transmitting antenna and is given by the following equation:

$$G^{-1} = \sqrt{\frac{1 + 3(U_1X_1 + U_2X_2 + U_3X_3)^2}{Y_1^2 + Y_2^2 + Y_3^2}} \tag{30}$$

Thus, all components of equation (29) are now known. The rotation matrix in terms of angles of rotation can be described as follows:

$$H = \begin{bmatrix} C\psi C\theta & S\psi C\theta & -S\theta \\ C\psi S\theta S\phi - S\psi C\phi & S\psi S\theta S\phi + C\psi C\phi & C\theta S\phi \\ C\psi S\theta C\phi + S\psi S\phi & S\psi S\theta C\phi - C\psi S\phi & C\theta C\phi \end{bmatrix} \tag{31}$$

where $\psi$ represents the azimuth angle, $\theta$ represents the elevation angle, and $\phi$ represents the roll angle of the receiving antenna. The letters S and C are abbreviations for the sine and cosine functions. Since the values for each of these components are known, these angles may be easily computed. For example, if the component in the second row, third column is divided by the component in the third row, third column, the cosine $\theta$ function may be cancelled out and $\phi$ can then be computed as the arctangent of these two components. Similarly, $\psi$ and $\theta$ may be computed.

Having determined the orientation angles of the coordinate frame for the receiving antenna, it is next necessary to determine the range, which is the distance between the receiving antenna and the transmitting antenna, to accurately describe the spatial orientation of the receiving antenna. This range may be determined by using the following equation:

$$R = (KG_TG_RG^{-1})^{\frac{1}{3}} \tag{32}$$

where K is a fixed system gain constant, $G_T$ and $G_R$ are the variable transmitter and receiver gains as set by the automatic gain control function and $G^{-1}$ is derived by using equation (30). In equation (30), X represents the transmission vector, Y represents the received vector and U represents the unit direction vector respectively. Once the range is known, the rectangular coordinates of the receiver can be determined in the X axis by multiplying $R \times U_1$, in the Y axis by multiplying $R \times U_2$ and in the Z axis by multiplying $R \times U_3$ where $U_1$, $U_2$ and $U_3$ are derived from equations (21)–(23).

These values now describe the complete spatial orientation of the receiving antenna and thus the helmet. The program listing attached as an appendix hereto may be used with the computer shown in FIG. 4 for performing these computations and for deriving the azimuth, elevation, and roll angles as well as the rectangular range coordinates.

It is possible that airframe fixed metal may result in error which is superimposed on the rotation maxtrix. Thus, the solution to airframe metal distortion is to map the inside of the cockpit by generating a known set of electromagnetic field vectors from a known transmitting antenna orientation and receiving these signals by a receiving antenna having a known orientation. Thus, the signals which the receiving antenna should receive can be predicted and the signals that the receiving antenna actually receives can be measured so that an error matrix can be developed for compensating for this source of error. The error matrix can be generated to be either multiplied with the rotation matrix or added to the measured matrix or the like. In the actual case covered by the program listing attached as an appendix hereto, a compensating matrix is generated which is equal to the product of the helmet rotation matrix and a delta matrix which is a function of the receiver location in the cockpit. As a result of the mapping of the aircraft cockpit, this delta function can be represented by a table look-up with interpolation or by a polynominal curve fit. The compensating matrix is then added to the Y input matrix to develop the true Y received vector matrix and is then inserted into the equations shown above so that the true rotation matrix can be determined.

The helmet itself can be a source of error. Although a mapping technique is necessary for airframe metal distortion since the receiving antenna's position varies in the cockpit, any distortion caused by the pilot's helmet is fixed and its effect needs only to be calculated once. Helmet distortion has not been taken into account in the attached programs since it is assumed to be negligible. However, as the metal associated with the helmet increases, it may be necessary to compensate for this source of metal also. This can be done quite simply by generating a fixed set of electromagnetic field vectors to a known helmet orientation and comparing the predicted received signal with the actual received signal. Thus, a distortion matrix can be generated.

Figure 1:
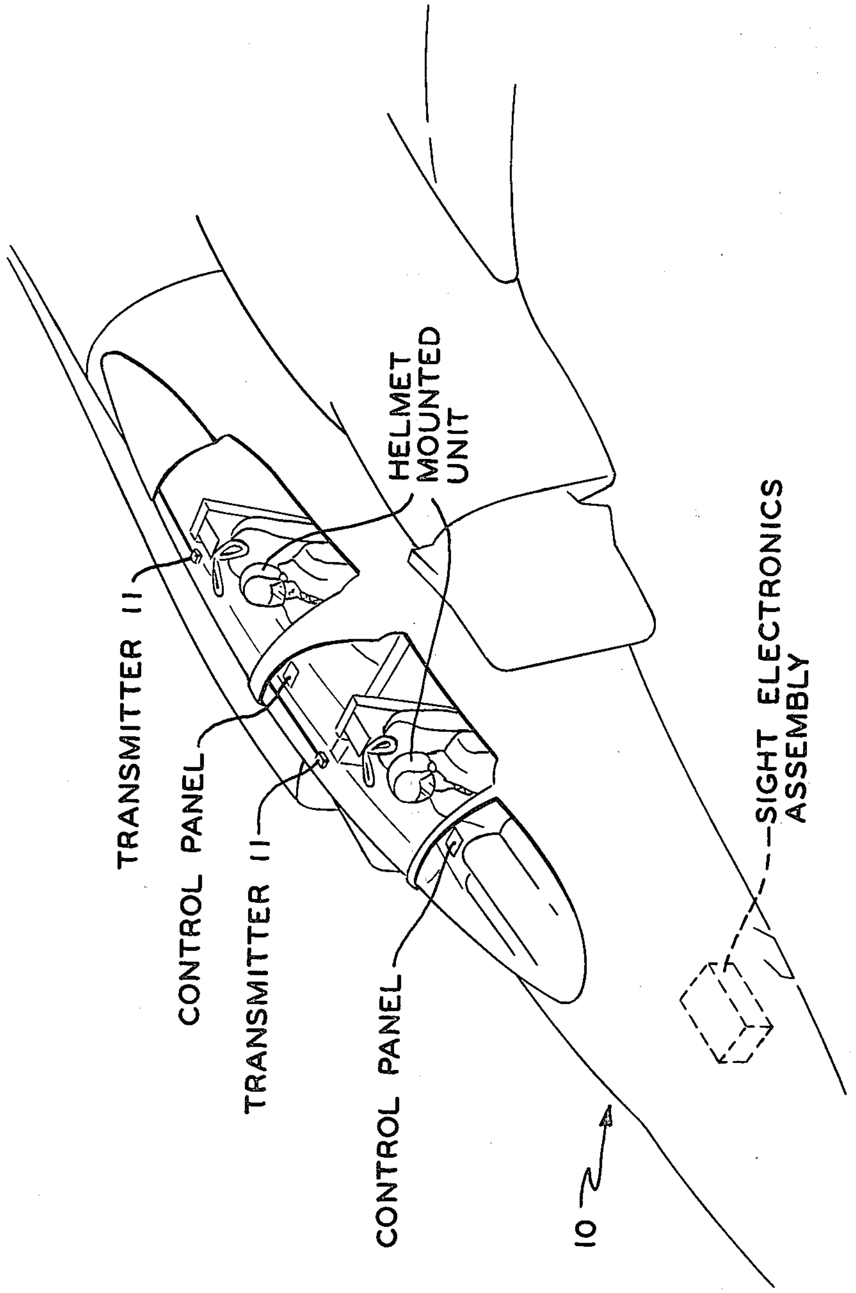
FIG. 1 is a drawing of an aircraft pilot wearing a helmet according to the instant invention.
Figure 2:
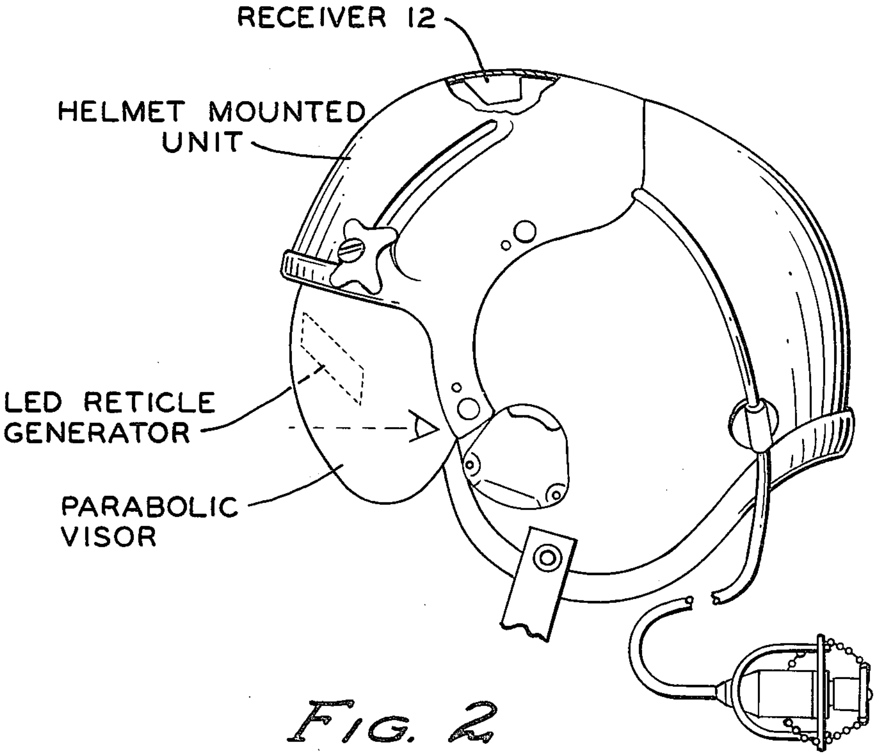
FIG. 2 is a drawing of the helmet according to the instant invention.
Figure 3:
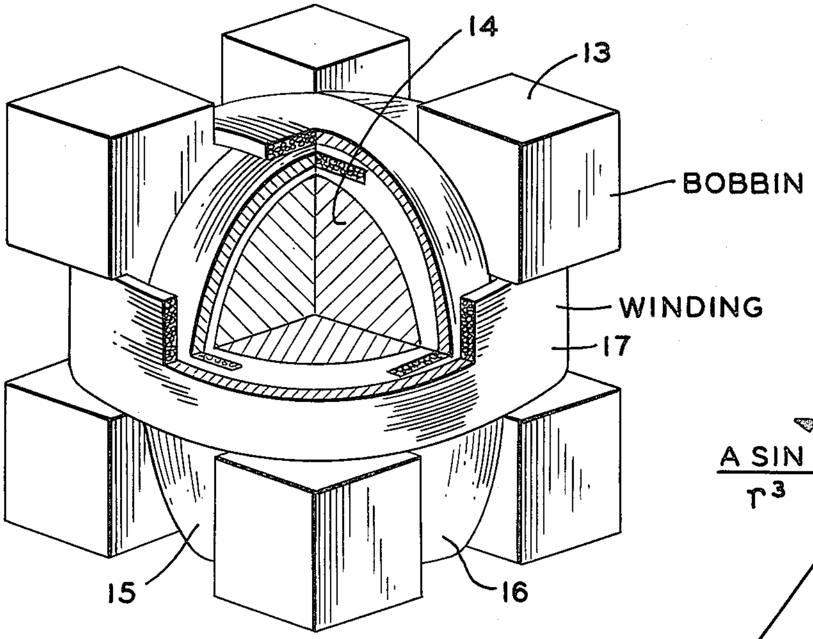
FIG. 3 is a drawing of an antenna which may be used for transmitting or receiving the electromagnetic field vectors used by the invention to determine helmet orientation.

The system for implementing the determination of helmet orientation is shown with respect to FIGS. 1–3 and will now be described. In FIG. 1, a pilot and his navigator or co-pilot are seated within the cockpit of an aircraft 10. Included in the cockpit are the control panels as indicated, the transmitting antennas 11, and the receiving antennas which are mounted to the helmets. The electronics is included in the aircraft fuselage. The helmet is shown in more detail in FIG. 2 and includes the parabolic visor on which is projected a reticle which the pilot uses to sight on a target. A reticle generator is attached to the inside of the helmet visor housing for the purpose of projecting the reticle. The receiving antenna 12 is fixedly attached to the helmet visor housing and receives the electromagnetic field vectors generated by the transmitting antenna. Each of the transmitting antennas and the receiving antennas may take the form shown in FIG. 3. Bobbin 13 is structured as shown and has a spherical void internally thereof for holding the ferrite core 14. Around the core are wound the three coils 15, 16 and 17 which then form the triad antenna.

Figure 4:
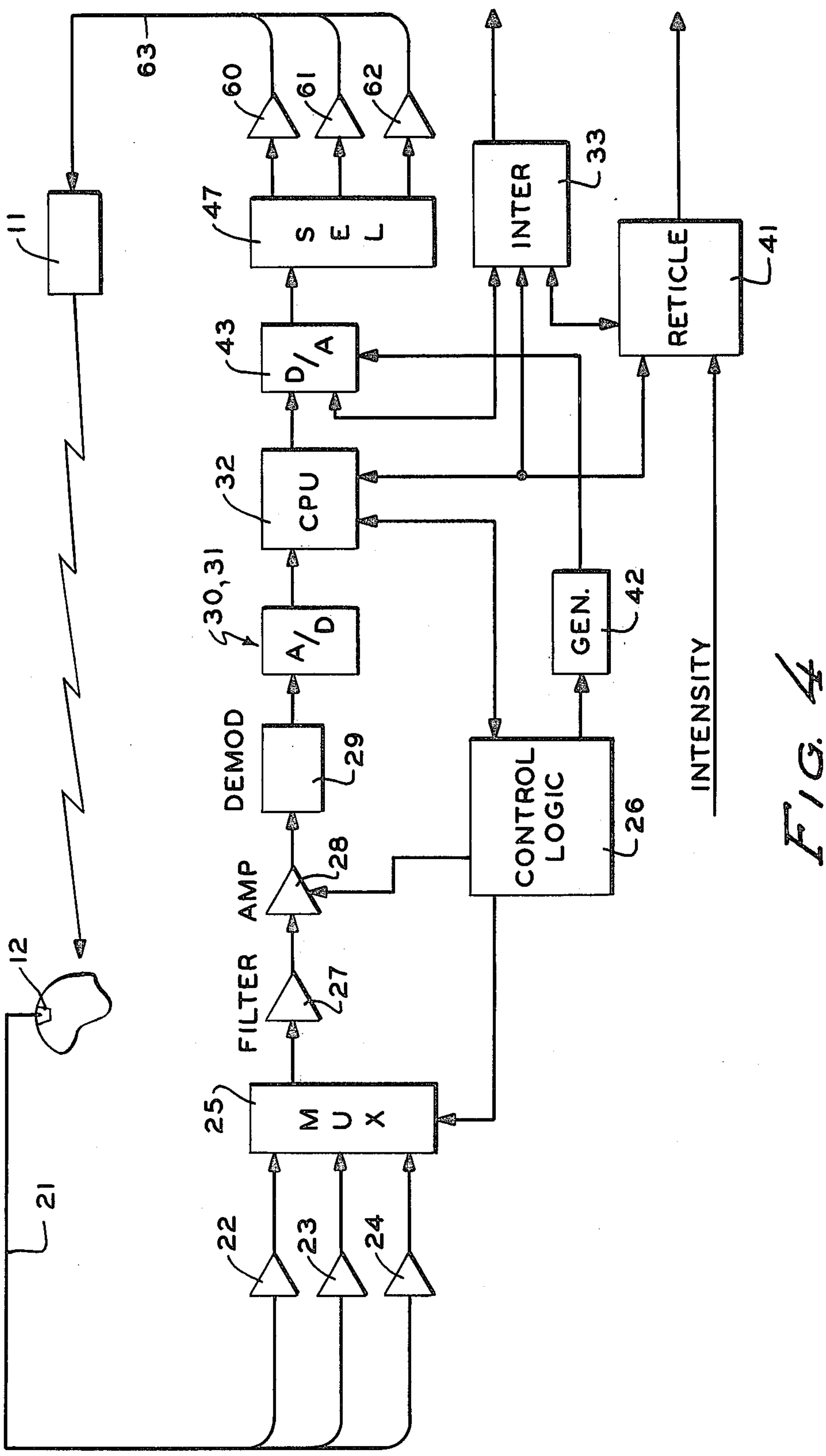
FIG. 4 is a block diagram of the system for carrying out the invention.

The system for determining helmet orientation is shown in block diagram form in FIG. 4. Receiving antenna 12 is connected over a cable 21 to pre-amplifiers 22, 23 and 24. One pair of lines in the cable is attached at one end to the X coil in antenna 12 and at the other end to pre-amplifier 22, a second pair of lines is attached at one end to the Y coil in antenna 12 and at its other end to pre-amplifier 23, and a third pair of wires in cable 21 is attached at one end to the Z coil in antenna 12 and at its other end to pre-amplifier 24. Since each of the pre-amplifiers is identical, only one pre-amplifier has been shown in detail in FIG. 5. The pre-amplifier involves a transformer front end and two stages of amplification for boosting the signal received from its associated coil of the receiving antenna to its output.

Figure 6:
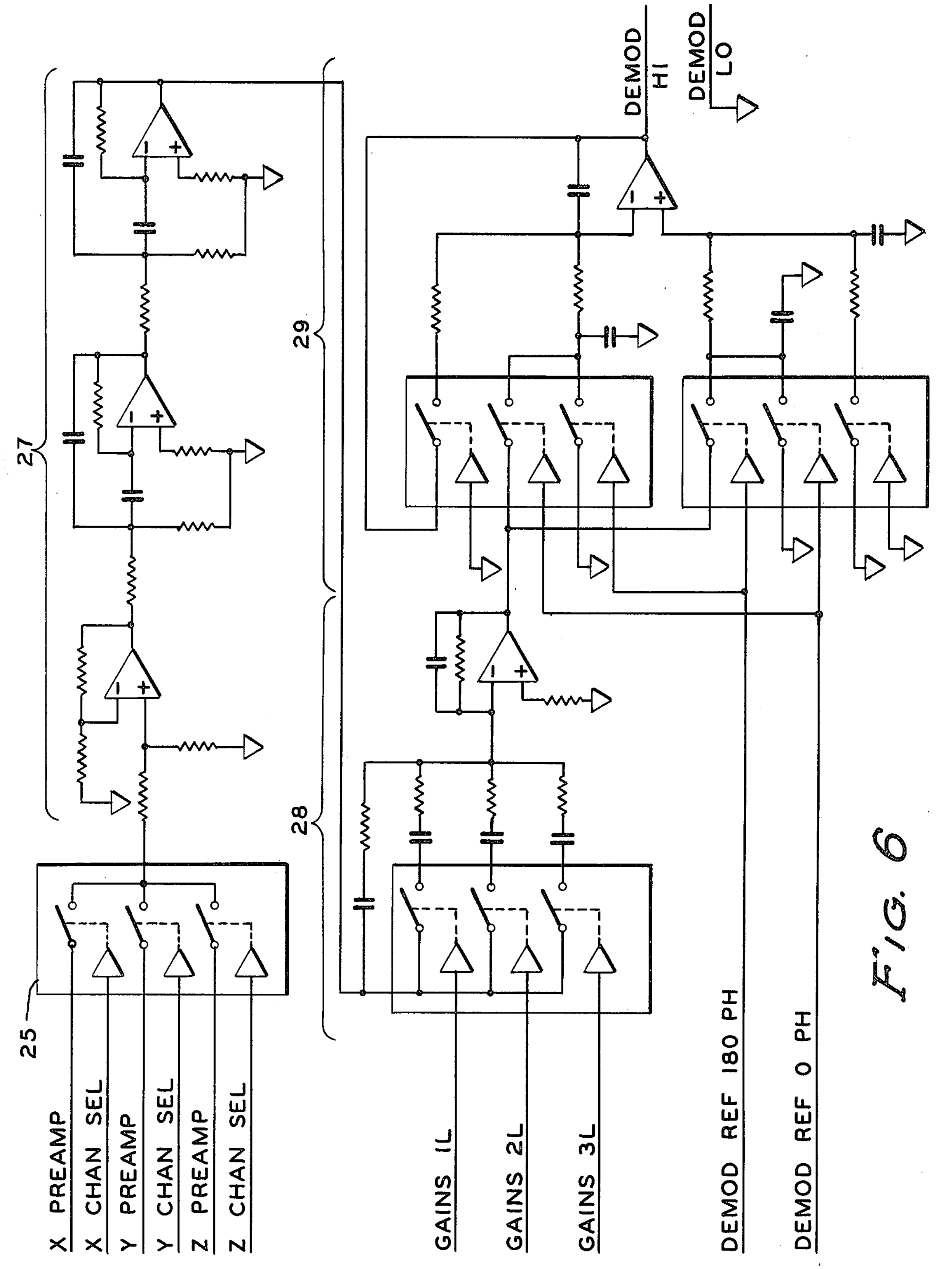
FIG. 6 is a schematic diagram showing the multiplexer, the bandpass filter, the gain control amplifier and the demodulator shown in FIG. 4.
Figure 7:
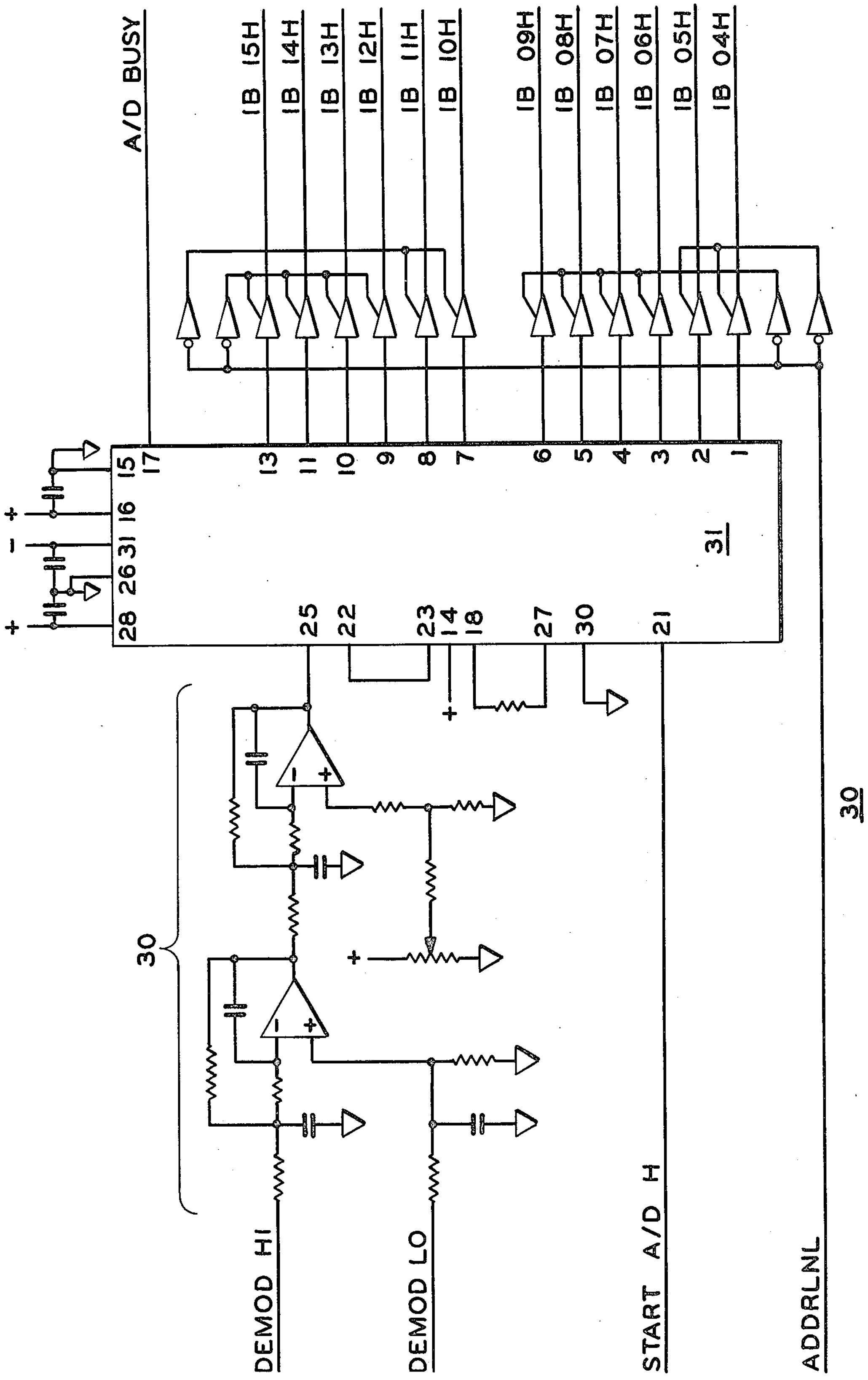
FIG. 7 shows the analog-to-digital converter shown in FIG. 4.

The output of each pre-amplifier is then connected to the input to multiplexer 25 which also receives an input from control logic 26. Control logic 26 selects which of the inputs to multiplexer 25 is to be connected to its output. The output of multiplexer 25 is then filtered by bandpass filter 27, amplified by a gain changeable amplifier 28 and demodulated by demodulator 29. FIG. 6 shows the details of multiplexer 25, bandpass filter 27, gain changeable amplifier 28 and demodulator 29. Connected to the three inputs of multiplexer 25 are the X, Y and Z pre-amplifier outputs which can then be switched selectively to the input of bandpass filter 27. The selection is made by the control logic which supplies appropriate signals over the X, Y and Z channel select lines. The signal connected to the input to bandpass filter 27 is then filtered and connected through gain changeable amplifier 28. The gain of the amplifier is selected over the three gain select lines as shown by control logic circuit 26. The output from amplifier 28 is demodulated by synchronous demodulator 29 which then supplies its output to the low pass filter and analog-to-digital converter 30, 31. As shown in FIG. 7, the analog-to-digital converter 31 samples the incoming analog signals and may be supplied under the standard part number AD 572 and is connected as shown. The start signal is derived from the control logic for the module 31 and its outputs are connected through a plurality of latches as shown and are then connected over a 12-bit bus to the input of the central processing unit 32. These latches are under the control of an input line which is also connected from the control logic circuit. Thus, when the computer wishes to read the information at the output of converter module 31, it gates the latches to pass the information through to the computer.

The processor may be a Honeywell HDP-5301 and may be programmed according to the program listing attached as the appendix to perform the computations as described above. The output from the computer is then connected through an interface circuit 33 which is then used to control the particular instrumentality of the vehicle to which it is connected, examples for which have been shown above. In addition, the computer controls a reticle control apparatus 41 which is manufactured by Honeywell is presently used on the YG11-76A01 IHADSS system.

Figure 9A:
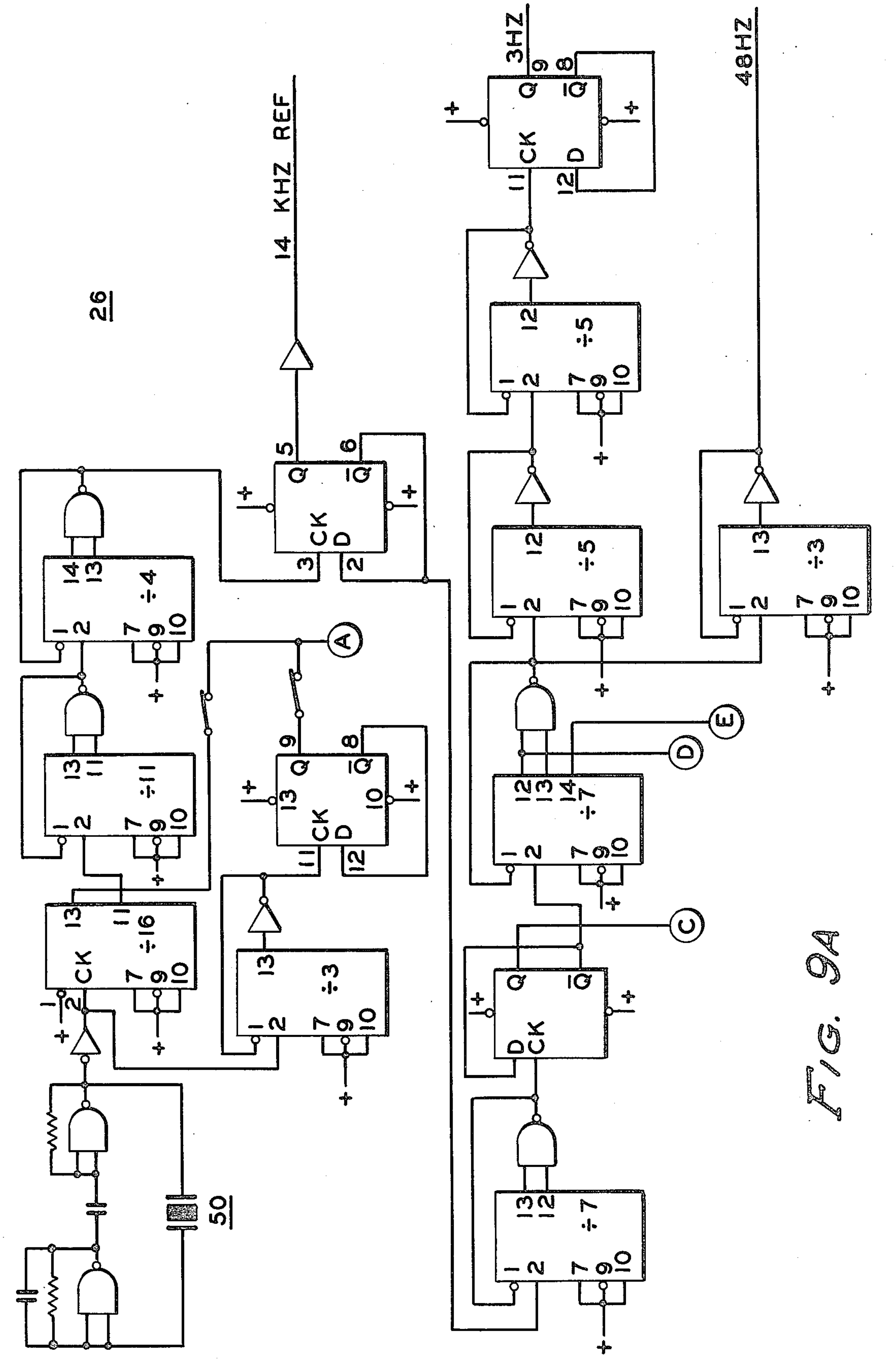
FIGS. 9A-9D show the control logic circuit shown in FIG. 4.
Figure 9B:
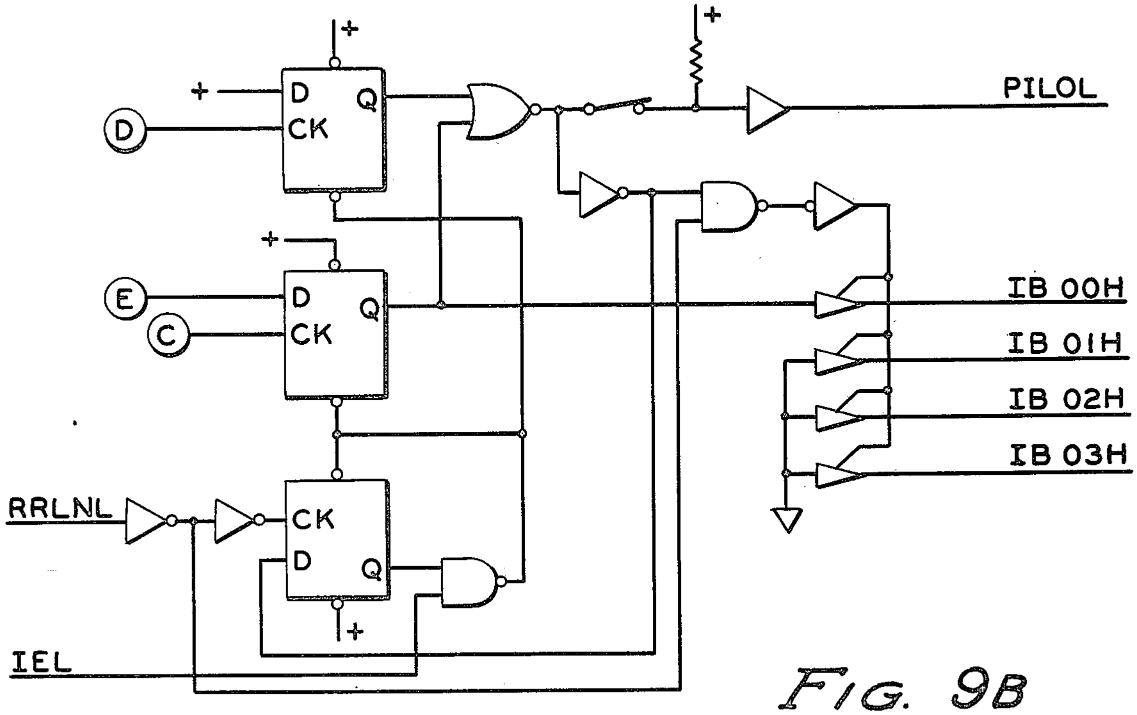
Figure 9D:
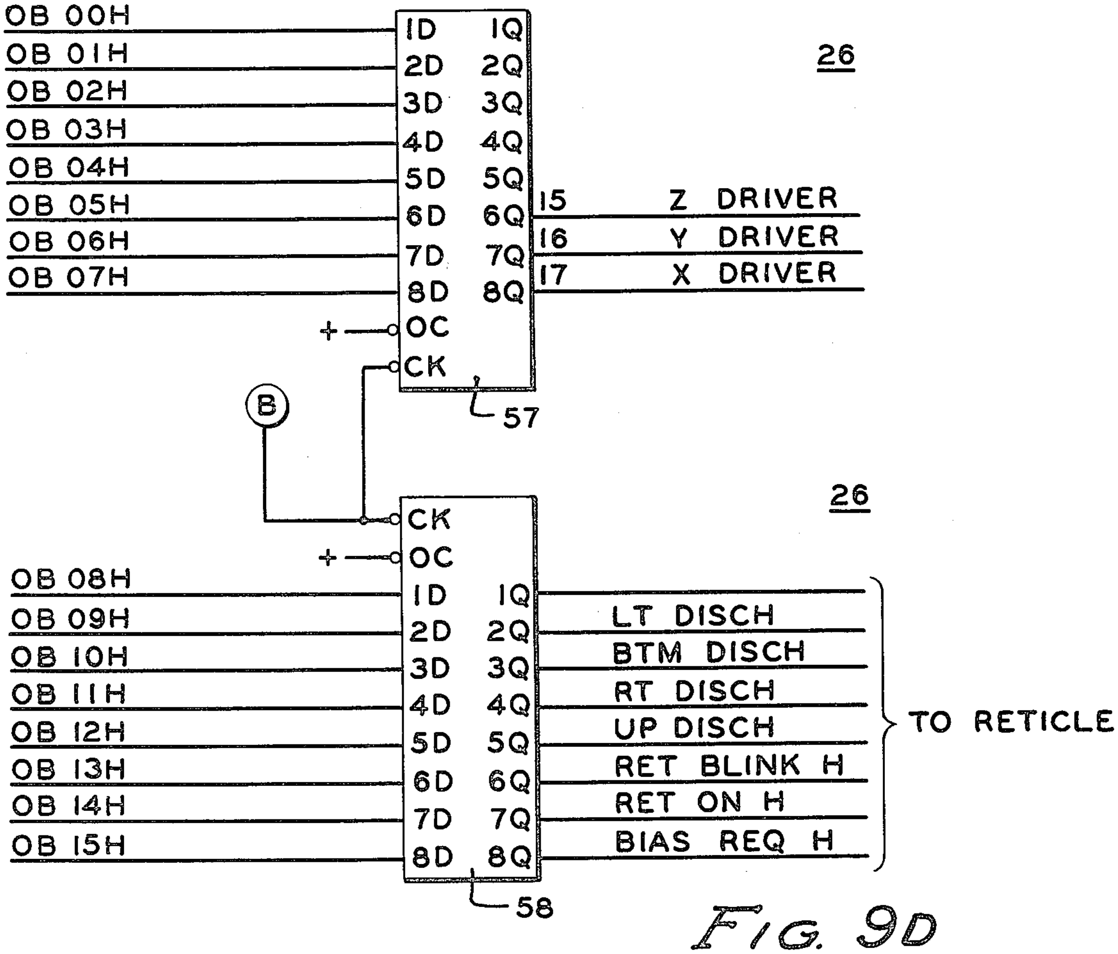

Control logic 26 is shown in more detail in FIGS. 9A–9D. This logic can be broken down into four major components as shown. The first component is shown in FIG. 9A and is the countdown logic which provides a plurality of output signals as shown based upon the 20 MHz oscillator 50. All of the dividers shown in this schematic may be purchased under the Standard Part Number 54LS74. The function of this circuit is to divide the 20 MHz signal from oscillator 50 into three signals having the frequency shown for use by the rest of the apparatus. The circuit shown in FIG. 9B is the computer interrupt circuit and is connected to the countdown logic as shown by the circled reference numerals and to two lines of the bus interconnecting the various circuits shown in FIG. 4 at RRLNL and IEL. This circuit provides input interrupt addresses IB00H–IB03H to the computer over the input bus as shown along with the real time interrupt PILOL.

Figure 9C:
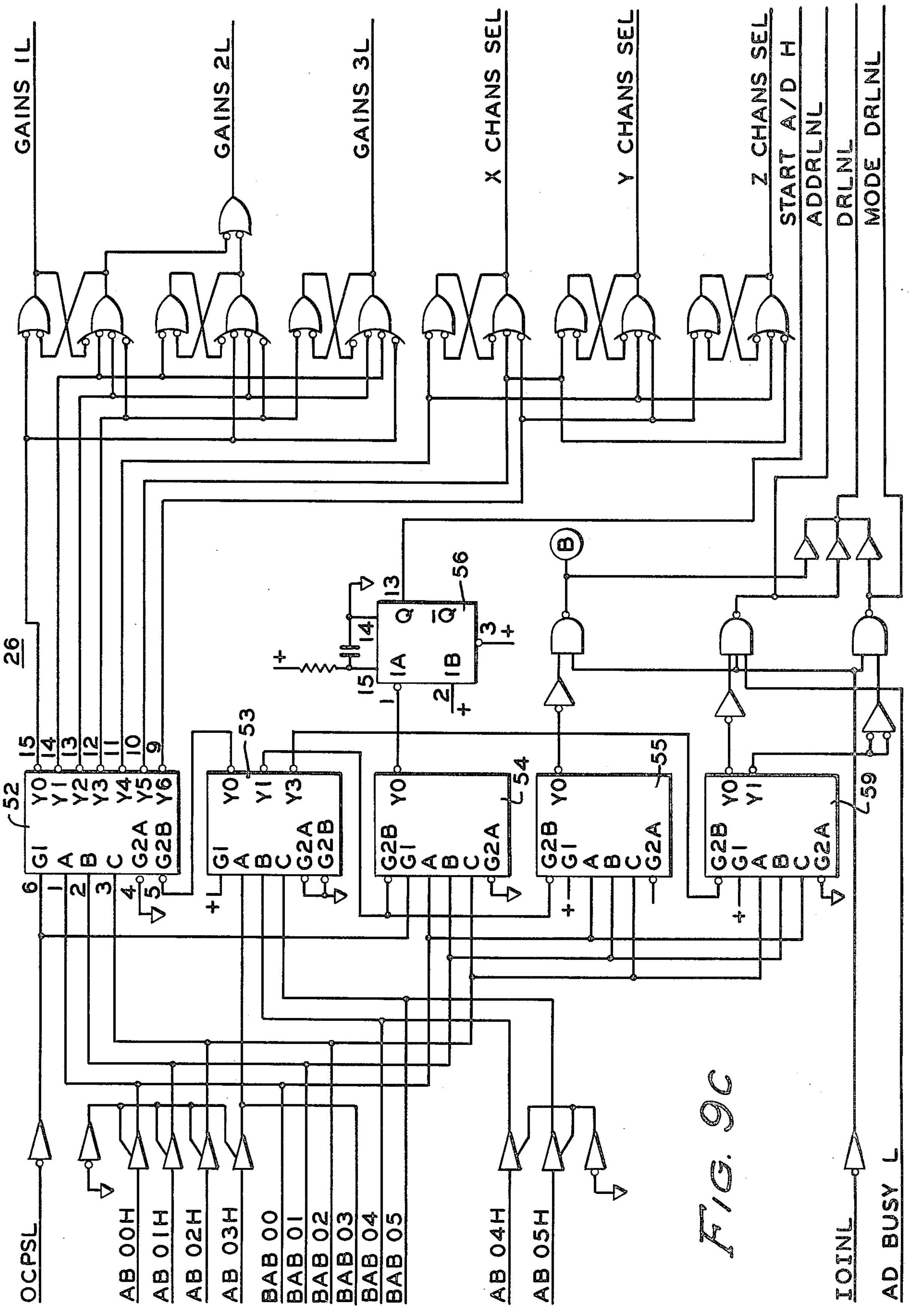

FIG. 9C is the I/O address decode logic required to facilitate the use of the central processor to control the various blocks of I/O hardware. The computer will output specific addresses, ABXXH, to the input suffers along with an output pulse, OCPSL. The decoders 52 and 53 will decode the address and set a group of latches 26 as required to select the input channel or gain. Decoders 53 and 54 are used to start the A/D converter by outputting a pulse to a one shot (56). The output of the one-shot has the proper pulse width to start the A/D converter. Decoders 53 and 55 generate an output pulse on B that will load the registers 57 and 58 shown on FIG. 9D. Decoders 53 and 59 generate an output pulse ADDRLNL that will enable the output gates on the A/D converter shown on FIG. 7 and permit the central processor to read the contents.

The D flip-flops in FIG. 9B may be manufactured under the Standard Part No. 54LS74 and the circuits 52, 53, 54 and 59 may all be manufactured under the Standard Part No. 54LS138. In addition, the flip-flop 56 may be manufactured under the Standard Part. No. 54LS123 and is connected in a one-shot multivibrator configuration. Latches 57 and 58 may be supplied under the Standard Part No. 54LS374.

Figures 5, 10, 11:
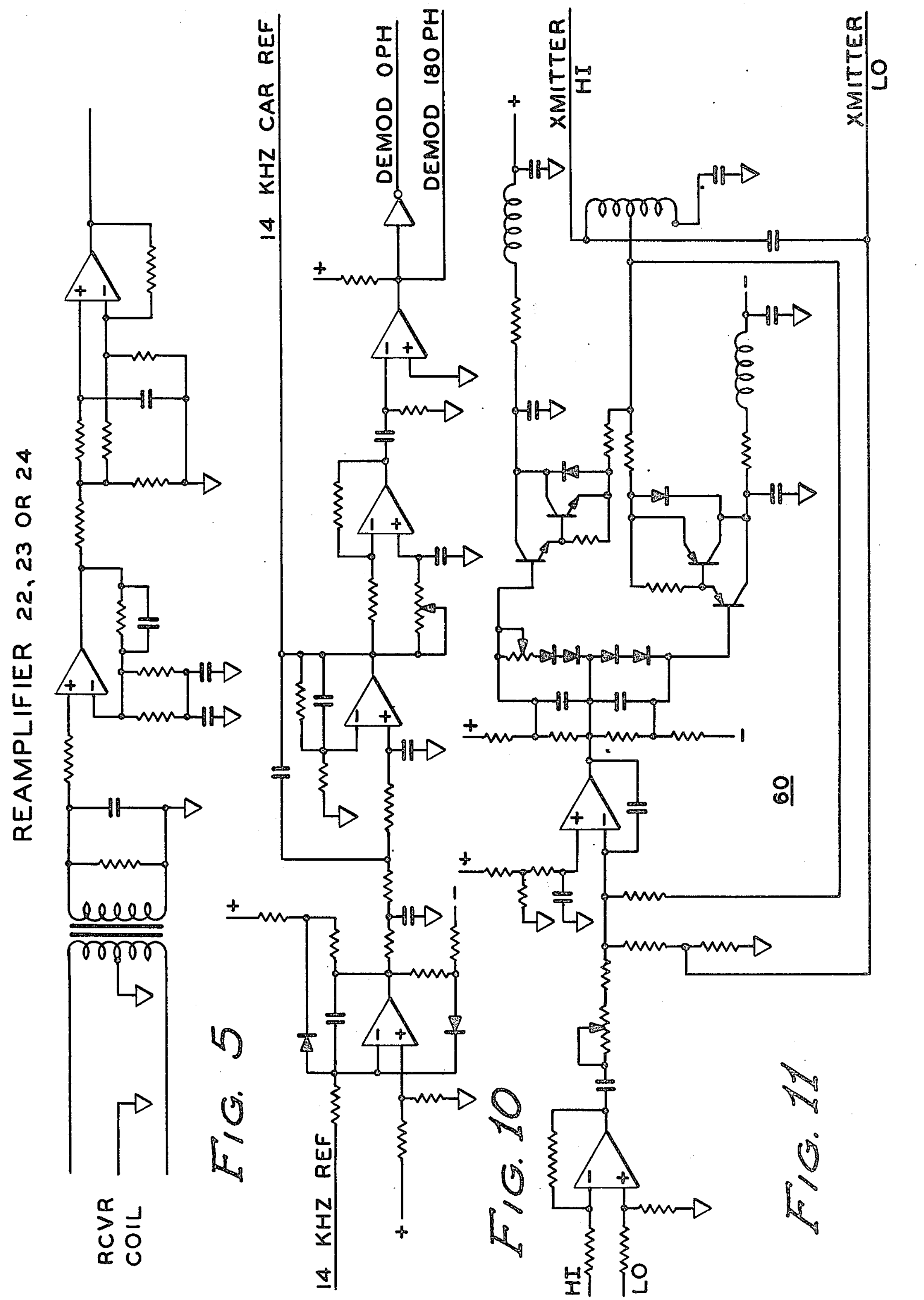
FIG. 5 is a schematic diagram of one of the preamplifiers shown in FIG. 4.
FIG. 10 shows the detailed schematic of the carrier reference generator shown in FIG. 4.
FIG. 11 is a schematic diagram of one of the driver amplifiers shown in FIG. 4.

Carrier generator 42 shown in FIG. 4 is shown in more detail in FIG. 10 and receives the 14 KHz square wave reference signal from the output of the control logic and shapes it into a 14 KHz carrier as a reference signal to digital-to-analog converter 43. In addition, the carrier generator supplies reference signals to the demodulator 29 as shown by the DEMOD OPH and DEMOD 180PH output lines from FIG. 10 and the same lines as inputs to FIG. 6.

Figure 8:
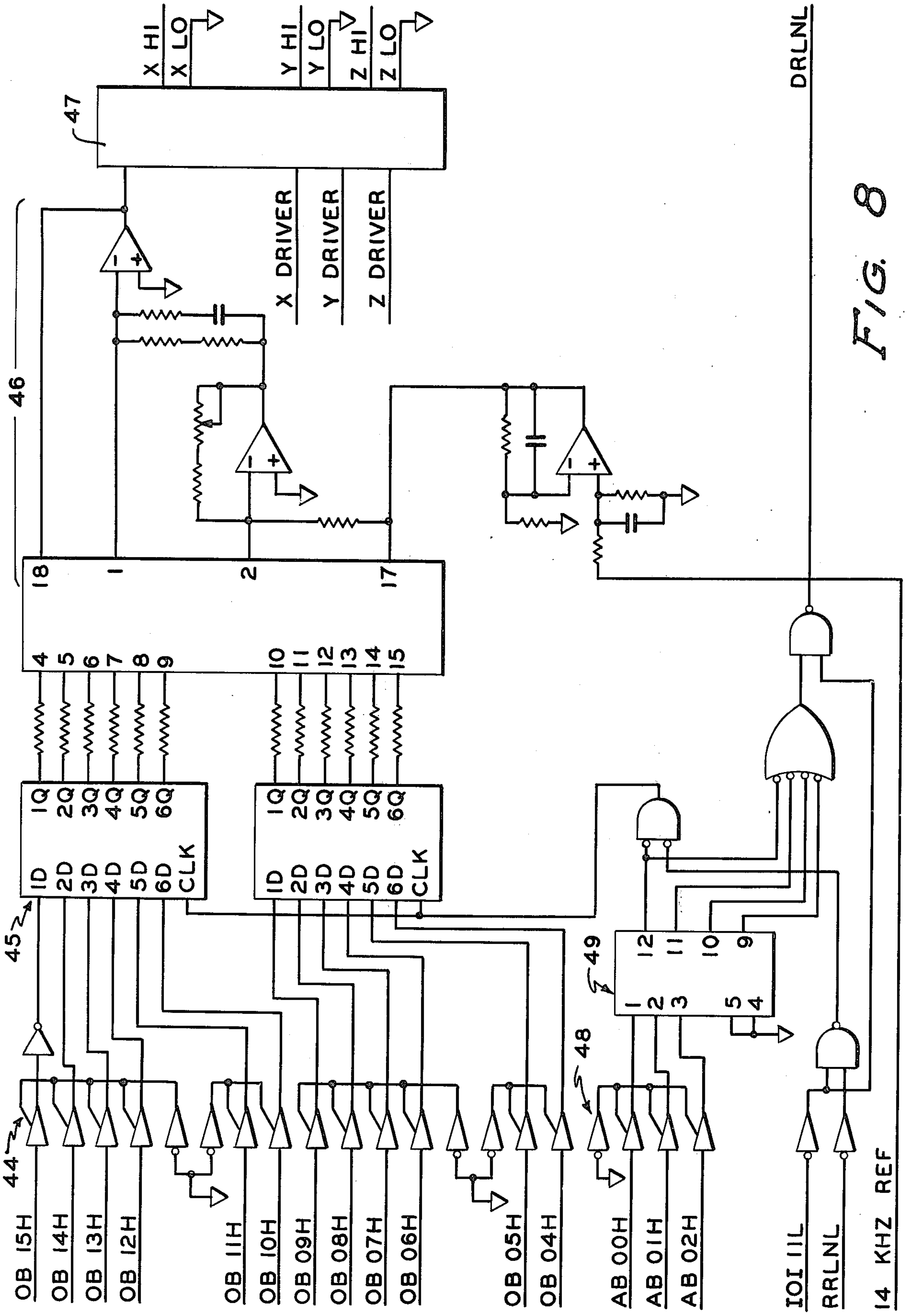
FIG. 8 shows the digital-to-analog converter shown in FIG. 4.

The digital-to-analog converter is shown in more detail in FIG. 8 and has a plurality of buffers 44 for buffering the outputs from computer 32 to the inputs of latches 45. The outputs from latches 45 are then connected to the digital-to-analog converter 46. The resistor ladder and switches may be supplied under the Standard Part No. 7541. The amplifiers on the output of the ladder network are current to voltage converters and are required as shown for bipolar output. The multiplex 47 is used to select which driver is used and is selectively stepped to the X, Y and Z outputs by computer control of the select inputs SEL. The 14 KHz reference signal from the output of carrier generator 42 is used as a reference signal to the D/A converter 46. In addition, a set of buffers 48 connect certain address lines of the address bus to decoder 49 which then provides the clock input to latches 45.

The X, Y and Z outputs from multiplex switch 47 are then connected to an appropriate driving amplifier 60, 61 and 62 respectively. Since these amplifiers are the same, only one is shown in detail in FIG. 11. The output of amplifier 60 is then connected over cable 63 to its associated coil in transmitting antenna. Thus, the two-wire output from amplifier 60 is connected through cable 63 to the X coil of transmitting antenna 11, the two-wire output from amplifier 61 is connected through cable 63 to the Y coil of transmitting antenna 11, and the two-wire output from amplifier 62 is connected through cable 63 to the Z coil of transmitting antenna 11. These amplifiers simply boost the output signal from the selector switch 47 to sufficient power levels for energizing transmitting antenna 11.

Figure 13:
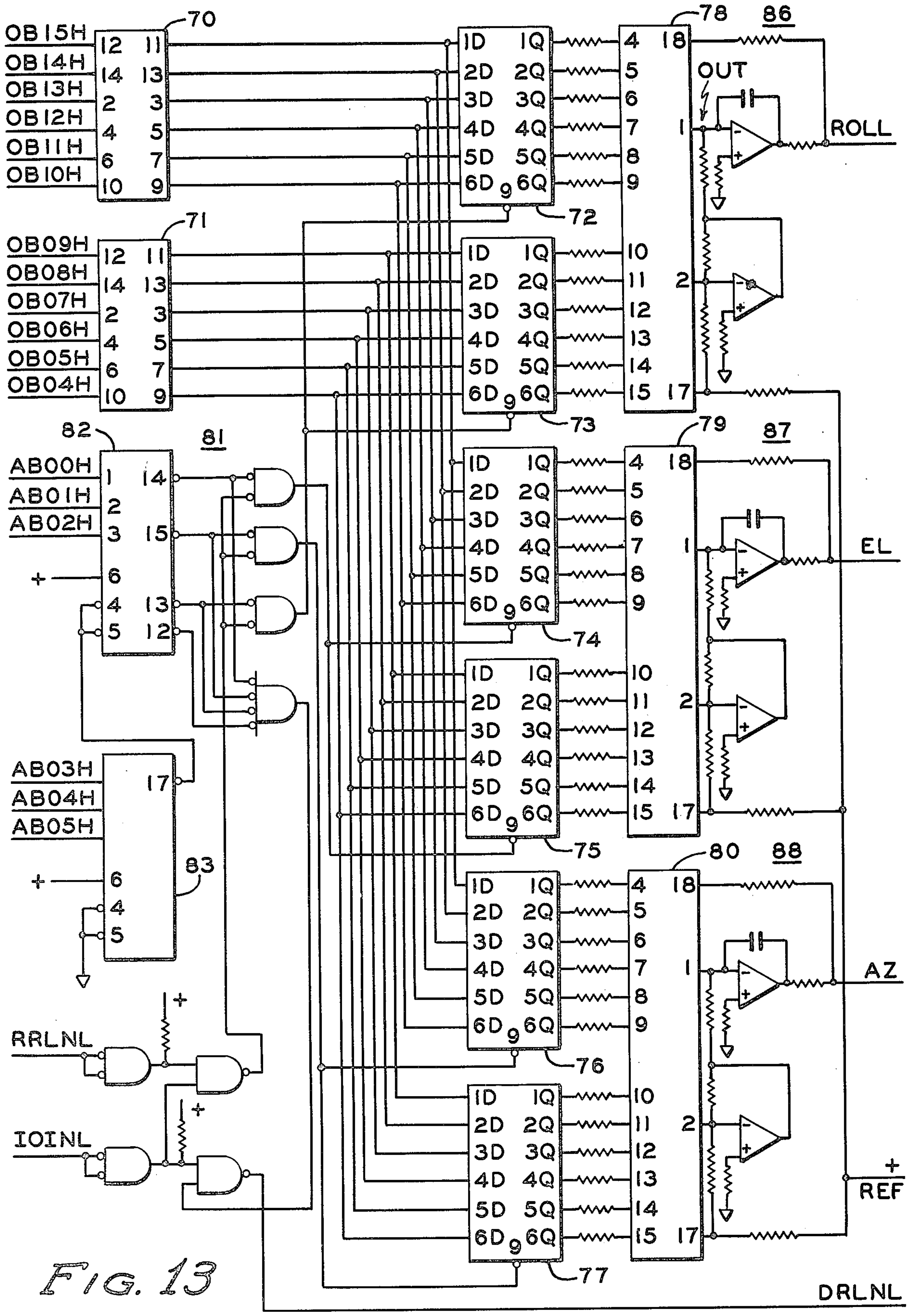
FIG. 13 shows the aircraft interface shown in FIG. 4.

FIG. 13 shows the aircraft interface 33 of FIG. 4 in more detail. This circuit comprises a pair of buffers 70 and 71 having inputs connected to the output bus of the processor and outputs connected to latches 72–77. Buffers 70 and 71 may be supplied under the Standard Part No. 54LS367. The outputs from latches 72 and 73 are connected to the inputs of digital-to-analog converter 78, the outputs from latches 74 and 75 are connected to the inputs of digital-to-analog converter 79 and the outputs from latches 76 and 77 are connected to the input of digital-to-analog converter 80. The clock terminal for latches 72–77, shown generally as terminal 9 thereof, are supplied by a decoding network 81 which is comprised of decoders 82 and 83 and a series of gates as shown. Decoders 82 and 83 may be supplied under the Standard Part No. 54LS138. This arrangement also provides the signal for the device ready line DRLNL. The output from converter 78 is amplified at 86 to provide the roll output, the output from converter 79 is amplified at 87 to provide the elevation output EL and the output from converter 80 is amplified at 88 to provide the azimuth output AZ. The roll, elevation and azimuth outputs are then used as inputs to whatever instrumentality of the aircraft is to be controlled.

The embodiments of the invention in which an exclusive property or right is claimed are defined as follows:

1. An electromagnetic system for use in determining the orientation of a helmet comprising:

a transmitting antenna for transmitting electromagnetic field vectors, said transmitting antenna having at least two transmitting coils;

a receiving antenna having three non-coplanar receiving coils fixed to the helmet, said receiving coils sensing the electromagnetic field vectors transmitted by said transmitting antenna;

control means for sampling said electromagnetic field vectors sensed by each of said receiver coils, said control means including orientation means for determining the orientation of said helmet using said sensed and said transmitted electromagnetic field vectors, said control means having a first output for supplying said orientation to a utilization means, and a second output;

driving means for supplying driving energy to said transmitting antenna for transmitting said electromagnetic field vectors; and, selector means connected to said second output from said control means and to said driving means for sequentially energizing said at least two transmitting coils.

2. The system of claim 1 wherein said control means comprises a multiplexer having three inputs, one input connected to a corresponding receiving coil and having an output.

3. The system of claim 2 wherein said control means comprises an analog-to-digital converter means having an input connected to the output of said multiplexer and having a converter output.

4. The system of claim 3 wherein said input of said analog-to-digital converter means comprises a bandpass filter having an input connected to the output of said multiplexer and an output.

5. The system of claim 4 wherein each of said inputs of said multiplexer comprises a corresponding preamplifier.

6. The system of claim 5 wherein said input of said analog-to-digital converter means further comprises a gain changeable amplifier having an input connected to the output of said bandpass filter and an output.

7. The system of claim 6 wherein said control means further comprises computer means having an input connected to the output of said analog-to-digital converter means and further having said first output connected to said utilization means and a digital-to-analog converter having said second output.

8. The system of claim 7 wherein said selector means has an input connected to said second output of said computer means, and said driving means comprises a first driver connected between a first output of said selector means and one of said coils of said transmitting antenna and a second driver connected to a second output from said selector means and to a second coil of said transmitting means.

9. The system of claim 8 wherein said selector means comprises a stepping switch for sequentially connecting said second output of said control means to said first and second drivers.

10. The system of claim 7 wherein said selector means has an input connected to the second output of said computer means and further has first, second and third outputs, and said driving means comprises a first driver connected between said first output of said selector means and a first coil of said transmitting antenna, a second driver connected between a second output of said selector means and a second coil of said transmitting antenna, and a third driver connected between said third output from said selector means and a third coil of said transmitting antenna.

11. The system of claim 10 wherein said selector means comprises a stepping switch.

12. The system of claim 1 wherein said control means further comprises computer means having an input connected to the three coils of said receiving antenna and further having said first output connected to said utilization means and a digital-to-analog converter having said second output.

13. The system of claim 12 wherein said selector means has an input connected to said second output of said computer means, and said driving means comprises a first driver connected between a first output of said selector means and one of said coils of said transmitting antenna and second driver connected to a second output from said selector means and to a second coil of said transmitting antenna.

14. The system of claim 13 wherein said selector means comprises a stepping switch for sequentially connecting said second output of said computer means to said first and second drivers.

15. The system of claim 12 wherein said selector means has an input connected to the second output of said computer means and further has first, second and third outputs, and said driving means comprises a first driver connected between said first output of said selector means and a first coil of said transmitting antenna, a second driver connected between a second output of said selector means and a second coil of said transmitting antenna, and a third driver connected between said third output from said selector means and a third coil of said transmitting antenna.

16. The system of claim 15 wherein said selector means comprises a stepping switch.

17. The system of claim 1 wherein said selector means has an input connected to the second output of said control means and further has first, second and third outputs, and said driving means comprises a first driver connected between said first output of said selector means and a first coil of said transmitting antenna, a second driver connected between a second output of said selector means and a second coil of said transmitting antenna, and a third driver connected between said third output from said selector means and a third coil of said transmitting antenna.

18. The system of claim 17 wherein said selector means comprises a stepping switch.

19. The system of claim 1 wherein said control means comprises an analog-to-digital converter for converting the analog signals received by the receiving antenna into digital form for use by said control means.

20. An electromagnetic system for determining the orientation of a helmet worn by the pilot of a vehicle comprising:

- a transmitting antenna having at least two transmitting coils generating electromagnetic field vectors;
- a receiving antenna having three non-coplanar receiving coils fixed to said helmet for sensing said electromagnetic field vectors transmitted by said transmitting antenna;
- driving means for sequentially energizing said transmitting coils for generating said electromagnetic field vectors;
- orientation determining means connected to said receiving antenna and to said driving means for determining a rotation matrix for the rotation of said receiving antenna from said transmitting antenna based upon both the transmitted electromagnetic field vectors and the sensed electromagnetic field vectors; and,
- implementation means connected to said orientation determining means for utilizing the orientation of said helmet for the control of a vehicle apparatus.

21. The system of claim 20 wherein said orientation determining means comprises means for compensating for distortions and noise due to metals in the vicinity of the receiving antenna.

22. The system of claim 21 wherein said orientation determining means comprises sampling means for sampling the signals received by said receiving antenna.

23. The system of claim 22 wherein said sampling means comprises a multiplexer having an input connected to each of the receiving coils of said receiving antenna and an output.

24. The system of claim 23 wherein said sampling means further comprises an analog-to-digital converter means having an input connected to the output of said multiplexer and having an output.

25. The system of claim 24 wherein said orientation determining means comprises control means having an input connected to the output of said analog-to-digital converter means for determining said rotation matrix and having a first output connected to said implementation means and a second output, said orientation determining means further comprising digital-to-analog converter means having an input connected to said second output and an output connected to said transmitting antenna.

26. The system of claim 25 wherein said transmitting antenna comprises three non-coplanar transmitting coils.

27. The system of claim 26 wherein said digital-to-analog converter means comprises a digital-to-analog converter module having an input connected to said second output of said control means and an output, said digital-to-analog converter means further comprising stepping switch means having an input connected to the output of said digital-to-analog converter module and at least two outputs, each output of said stepping switch means being connected to a corresponding transmitting coil.

28. The system of claim 20 wherein said orientation determining means comprises control means for determining said rotation matrix and having a first output connected to said implementation means and second output, said orientation determining means further comprising digital-to-analog converter means having an input connected to said second output and an output connected to said transmitting antenna.

29. The system of claim 28 wherein said transmitting antenna comprises three non-coplanar transmitting coils.

30. The system of claim 29 wherein said digital-to-analog converter means comprises a digital-to-analog converter module having an input connected to said second output of said control means and output, said digital-to-analog converter means further comprising stepping switch means having an input connected to the output of said digital-to-analog converter module and three outputs, each output of said stepping switch means being connected to a corresponding transmitting coil.

31. An electromagnetic system for determining the orientation of a helmet worn by the pilot of a vehicle comprising:

- a transmitting antenna having at least two transmitting coils for generating electromagnetic field vectors;
- a receiving antenna having three non-coplanar receiving coils fixed to said helmet for sensing said electromagnetic field vectors transmitted by said transmitting antenna;
- driving means for sequentially energizing said transmitting coils for generating said electromagnetic field vectors;
- orientation determining means connected to said receiving coils and to said driving means for determining a rotation matrix for the rotation of said receiving antenna from said transmitting antenna by using the eigenvalues and eigenvectors determined from a transmitting matrix based upon said transmitted electromagnetic field vectors and a received matrix based upon said sensed electromagnetic field vectors; and,
- implementation means connected to said orientation determining means for utilizing the orientation of said helmet for the control of a vehicle apparatus.

32. The system of claim 31 wherein said orientation determining means comprises means for compensating for distortions and noise due to metals in the vicinity of the receiving antenna.

33. The system of claim 32 wherein said orientation determining means comprises sampling means for sampling the signals received by said receiving antenna.

34. The system of claim 33 wherein said sampling means comprises a multiplexer having an input connected to each of the receiving coils of said receiving antenna and an output.

35. The system of claim 34 wherein said sampling means further comprises an analog-to-digital converter means having an input connected to the output of said multiplexer and having an output.

36. The system of claim 35 wherein said sampling means further comprises an analog-to-digital converter means having an input connected to the output of said multiplexer and having an output.

37. The system of claim 36 wherein said orientation determining means comprises control means having an input connected to the output of said analog-to-digital converter means for determining said rotation matrix and having a first output connected to said implementation means and a second output, said orientation determining means further comprising digital-to-analog converter means having an input connected to said second output and an output connected to said transmitting antenna.

38. The system of claim 37 wherein said transmitting antenna comprises three non-coplanar transmitting coils.

39. The system of claim 38 wherein said digital-to-analog converter means comprises a digital-to-analog converter module having an input connected to said second output of said control means and an output, said digital-to-analog converter means further comprising stepping switch means having an input connected to the output of said digital-to-analog converter module and at least two outputs, each output of said stepping switch means being connected to a corresponding transmitting coil.

40. The system of claim 31 wherein said orientation determining means comprises control means for determining said rotation matrix and having a first output connected to said implementation means and second output, said orientation determining means further comprising digital-to-analog converter means having an input connected to said second output and an output connected to said transmitting antenna.

41. The system of claim 40 wherein said transmitting antenna comprises three non-coplanar transmitting coils.

42. The system of claim 41 wherein said digital-to-analog converter means comprises a digital-to-analog converter module having an input connected to said second output of said control means and output, said digital-to-analog converter means further comprising stepping switch means having an input connected to the output of said digital-to-analog converter module and three outputs, each output of said stepping switch means being connected to a corresponding transmitting coil.

* * * * *

UNITED STATES PATENT OFFICE

CERTIFICATE OF CORRECTION

PATENT NO. : 4,287,809

DATED : September 8, 1981

INVENTOR(S) : Werner H. Egli, Dennis Kuhlmann, Jack E. Wier

It is certified that error appears in the above-identified patent and that said Letters Patent are hereby corrected as shown below:

Column 10, line 23, cancel "means" and substitute --antenna--.

Signed and Sealed this

***Twenty-second* Day of *December 1981***

[SEAL]

*Attest:*

GERALD J. MOSSINGHOFF

*Attesting Officer* *Commissioner of Patents and Trademarks*